(12) United States Patent
Mohammad et al.

(10) Patent No.: US 11,818,832 B2
(45) Date of Patent: Nov. 14, 2023

(54) SOCKET LOAD REGULATION UTILIZING CPU CARRIERS WITH SHIM COMPONENTS

(71) Applicant: Intel Corporation, Santa Clara, CA (US)

(72) Inventors: Feroz Mohammad, Chandler, AZ (US); Ralph V. Miele, Hillsboro, OR (US); Thomas Boyd, Vancouver, WA (US); Steven A. Klein, Chandler, AZ (US); Gregorio R. Murtagian, Phoenix, AZ (US); Eric W. Buddrius, Hillsboro, OR (US); Daniel Neumann, Newberg, OR (US); Rolf Laido, Sherwood, OR (US)

(73) Assignee: Intel Corporation, Santa Clara, CA (US)

( * ) Notice: Subject to any disclaimer, the term of this patent is extended or adjusted under 35 U.S.C. 154(b) by 721 days.

(21) Appl. No.: 16/828,447

(22) Filed: Mar. 24, 2020

(65) Prior Publication Data

US 2021/0307153 A1    Sep. 30, 2021

(51) Int. Cl.
*H05K 1/02*    (2006.01)
*H01R 12/85*    (2011.01)
*H05K 7/20*    (2006.01)
*H01L 23/40*    (2006.01)
*H05K 1/18*    (2006.01)

(52) U.S. Cl.
CPC ....... *H05K 1/0203* (2013.01); *H05K 7/20509* (2013.01); *H01L 2023/405* (2013.01); *H01L 2023/4087* (2013.01); *H01R 12/85* (2013.01); *H05K 1/181* (2013.01); *H05K 2201/10325* (2013.01)

(58) Field of Classification Search
CPC ............... H05K 1/0203; H05K 7/2049; H05K 7/20509; H01L 2023/405; H01L 2023/4087
See application file for complete search history.

(56) References Cited

U.S. PATENT DOCUMENTS

| | | | |
|---|---|---|---|
| 6,449,155 B1 * | 9/2002 | Colbert | H01L 23/4006 174/16.3 |
| 7,323,363 B1 * | 1/2008 | Kearns | G01B 21/20 257/785 |
| 2019/0393631 A1 * | 12/2019 | Haswarey | G06F 1/20 |

* cited by examiner

*Primary Examiner* — Zachary Pape
(74) *Attorney, Agent, or Firm* — Schwabe, Williamson & Wyatt, P.C.

(57) ABSTRACT

Embodiments disclosed herein include assemblies. In an embodiment, an assembly comprises a socket and a bolster plate on a board, where the bolster plate has load studs and an opening that surrounds the socket; a shim having first and second ends; and a carrier on the bolster plate, where the carrier has an opening and cutouts. The shim may have an opening through the first end as the second end is affixed to the carrier. The opening of the shim entirely over one cutout from a corner region of the carrier. In an embodiment, the assembly comprises an electronic package in the opening of the carrier, where the electronic package is affixed to the carrier, and a heatsink over the electronic package and carrier, where the first end is directly coupled to a surface of the heatsink and a surface of one load stud of the bolster plate.

7 Claims, 9 Drawing Sheets

SOCKET LOAD REGULATION UTILIZING CPU CARRIERS WITH SHIM COMPONENTS

TECHNICAL FIELD

Embodiments of the present disclosure relate to semiconductor devices, and more particularly to a multi-die package with stacked components that include shims with varying thicknesses.

BACKGROUND

The demand for miniaturization of form factor and increased levels of integration for high performance are driving sophisticated packaging approaches in the semiconductor industry. One such approach is to use microelectronic packages to enable miniaturization of small form factor and high performance. Such architectures generally depend on sockets with loading mechanisms (LMs) to stack and electrically couple electronic packages to boards. However, such architectures also have their own integration challenges.

One challenge is that the loads applied to the packages are affected by varying package thicknesses. For example, thicker packages have higher loads compared to thinner packages. Other challenges are that the differences in the LM thickness tolerances and package thickness ranges place various constraints on the architectures of the final packages, such as constraining the package layer count options, substrate core thicknesses, LM designs, LM spring material choices, costs, and heat spreader thicknesses that further impact the first level interconnect risks and thermal interface material risks.

Another challenge is that the loads on the LMs have to be within limited ranges for the sockets of the stacked packages to properly function, which additionally constraints the package thickness variations. However, the amount of tolerances for such constrained package thickness variations are typically not enough when multiple stacked products are aligned by socket technologies. Also package thickness tolerances are limited by the LM spring designs. Accordingly, the tolerance window of the loading mechanisms need to be increased beyond the limitations of such spring designs. As such, limitations on the LM thickness tolerances, the package thickness ranges, and the LM spring designs negate the benefits of the socket technologies—and are not desirable solutions.

EMBODIMENTS OF THE DETAILED DESCRIPTION

Figure 1A:
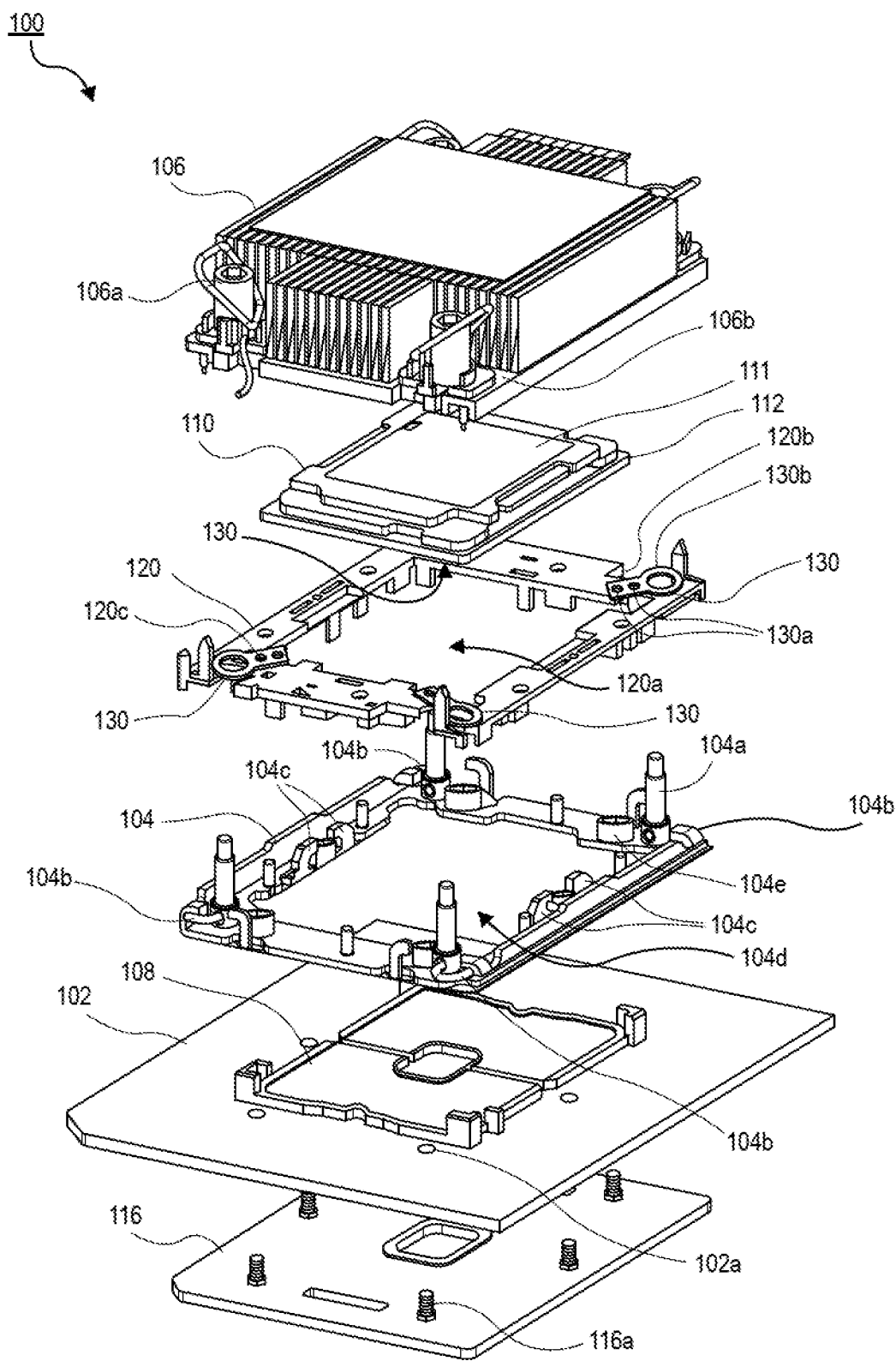
FIG. 1A is a perspective, exploded view illustration of an assembly with a heatsink, an electronic package, a carrier with a plurality of shims, a bolster plate, a board with a socket, and a back plate, in accordance with an embodiment.

Described herein are electronic packaged assemblies with stacked components that includes one or more shims, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, existing packaging assemblies are limited, at least in part, by socket technologies (e.g., land grid array (LGA) sockets) generally used to couple integrated circuit (IC) dies, electronic packages, and/or boards to each other. For example, such assemblies need to use loading mechanisms in order to accommodate for various loads applied by the sockets. However, loading mechanisms are also limited due to package thicknesses as thicker packages have higher loads compared to thinner packages.

Particularly, the loading mechanisms are designed with spring architectures that are restricted by the package thickness tolerances. For example, loads need to be within distinctive ranges for the sockets and other stacked components to properly function, which therefore restrains the package thickness variations. Accordingly, the existing assemblies suffer from limited package thickness tolerances when multiple components are stacked on top of each other and aligned to the respective socket. As such, limitations on package thickness ranges, spring architectures, and loading mechanism thickness tolerances negatively impact the final architecture of the assemblies—and negate the benefits of using such socket technologies.

Accordingly, embodiments disclosed herein include electronic packaged assemblies with stacked components such as heatsinks, dies, packages, carriers, bolster plates, and boards that include one or more shims. In particular, the carriers, such as those described herein, include a heatsink module carrier with shims. Carriers serve as a fixed component in the assemblies described herein to hold the processor packages to the heatsinks and to protect the socket contacts. In an embodiment, the carriers may include one or more shims with a desired thickness that are selectively positioned on such carriers. Whereas, in other embodiments, the shims may be disposed on any other stacked (or stackable) components of the assemblies.

The use of such shims allows the spring deflections of the loading mechanisms to be offset. Accordingly, the embodiments of the shims allow the loads of the loading mechanisms to be maintained within acceptable ranges, regardless of the thicknesses of the respective packages. That is, the embodiments allow for the packages and/or loading mechanisms to substantially increase the thickness tolerance ranges up to approximately limitless ranges/windows. As such, the embodiments described herein enable the packaging options of the assembly architectures to be substantially expanded without experiencing the negatives of a socket or any other stackable component.

Referring now to FIG. 1A, a perspective, exploded view illustration of an assembly 100 is shown, in accordance with an embodiment. Particularly, in the illustrated embodiment, the assembly 100 is shown before the stackable components are all stacked together. In some embodiments, the assembly 100 comprises a heatsink 106, an electronic package 110, a carrier 120 with a plurality of shims 130, a bolster plate 104, a board 102 with a socket 108, and a back plate 116. Also, referring to FIG. 1B, a plan view illustration of the respective carrier 120 with the shims 130 in FIG. 1A is shown, in accordance with an embodiment.

In an embodiment, the assembly 100 may be any type of electronic packaged assembly with a socket that aligns, couples, and stacks multiple components on top of each other. For example, the assembly 100 may be a flip-chip LGA (FCLGA) packaged assembly, an LGA packaged assembly, or the like. However, it is to be appreciated that other interconnect architectures (e.g., BGA, PGA, PoINT, eWLB, or the like) may be used for the assembly 100 instead of the LGA architecture shown. In an embodiment, the board 102 comprises a socket 108. The board 102 serves as a base that supports the socket 108 and the other illustrated components after such components are respectively stacked together on the board 102. In an embodiment, the board 102 may be a printed circuit board (PCB) or the like. As noted above, in one embodiment, the socket 108 may be an LGA socket or the like.

In an embodiment, the bolster plate 104 comprises a plurality of load studs 104a, a plurality of springs 104b with anchor ends 104c, an opening 104d, and a plurality of nuts 104e. The bolster plate 104 may be attached to the board 102 by the back plate 116. For example, the back plate 116 may have one or more screws 116a inserted through one or more openings 102a of the board 102, where the screws 116a are screwed into and secured with the nuts 104e of the bolster plate 104. In an embodiment, the opening 104d of the bolster plate 104 may fully surround the socket 108 when the bolster plate 104, the board 102, and the back plate 116 are stacked together.

In an embodiment, the bolster plate 104 may be any type of loading mechanism. For example, the bolster plate 104 may be a torsion fastener loading mechanism or the like. The bolster plate 104 serves as a loading mechanism that delivers the force to seat land pads of the electronic package 110 onto contacts of the socket 108, and distributes the resulting compressive load evenly through solder joints of the socket 108.

In an embodiment, the electronic package 110 comprises an integrated heat spreader (IHS) 111 and a die package substrate 112. In the illustrated embodiment, the IHS 111 is disposed over the die package substrate 112. In an embodiment, the die package substrate 112 may comprise a die electrically coupled to a package substrate. For example, the die may be a semiconductor die, an electronic device (e.g., a wireless device), an IC, a central processing unit (CPU), a graphic processing unit (GPU), a microprocessor (or processor), a platform controller hub (PCH), a memory (e.g., a high bandwidth memory (HBM)), a field-programmable gate array (FPGA), or the like. Additionally, in an embodiment, the package substrate 110 may be any suitable substrate material. For example, the package substrate 110 may comprise glass, ceramic, semiconductor materials (e.g., high or low resistivity silicon, group III-V semiconductors, or the like), or organic substrates (e.g., interposers, high density interconnect (HDI) substrates, embedded trace substrates (ETS), high density package (HDP) substrates, molded substrates, or the like).

In an embodiment, the carrier 120 comprises an opening 120a, a plurality of cutouts 120b (or cutout portions), and a plurality of alignment pins 120c. In some embodiments, the electronic package 110 may be positioned within the opening 120a of the carrier 120. That is, the opening 120a of the carrier 120 may fully surround the electronic package 110. In one embodiment, the carrier 120 may have one or more securing mechanisms (e.g., barbs, latches, snap-ins, etc.) that securely hold the electronic package 110 in place (i.e., in the opening 120a).

For one embodiment, the carrier 120 may be any type of package carrier mechanism used for the assembly of IC dies and heatsinks. For example, the carrier 120 may be a processor heatsink module (PHM) carrier that stacks the electronic package 110 and the heatsink 106 together. The carrier 120 serves as a package carrier that allows the assembly of the electronic package 110 and the heatsink 106 prior to the socket installation. Also, the carrier 120 serves as a package carrier that enables ease of installation (or assembly) of the electronic package 110 to the socket 108, while utilizing the load studs 104a of the bolster plate 104 to pre-align the heatsink 106, the electronic package 110, and the socket 108 to each other in order to minimize the risk of damaging the contacts of the socket 108.

Figure 1B:
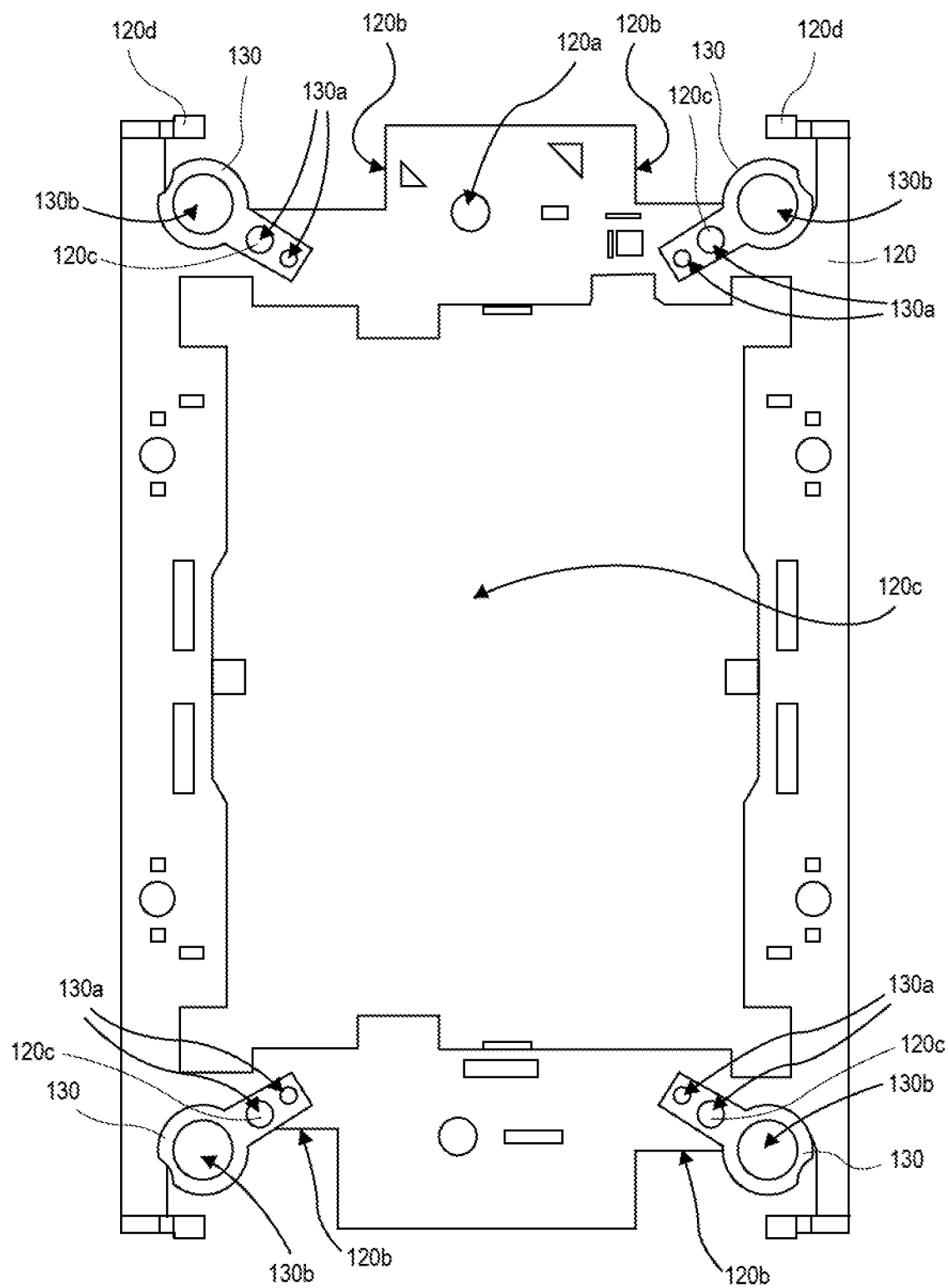
FIG. 1B is a plan view illustration of a carrier with a plurality of shims, in accordance with an embodiment.

As shown in greater detail in FIG. 1B, the shims 130 may comprise one or more openings 130a-b, where the openings 130b are larger than the openings 130a. In an embodiment, the shims 130 may be disposed on the corner regions of the top surface of the carrier 120. Particularly, as shown in FIG. 1B, the openings 130b of the shims 130 are directly positioned over the cutouts 120b of the carrier 120. In an embodiment, the shims 130 may be molded onto the carrier 120. For example, as shown in FIG. 1B, one of the openings 130a of the shims 130 may be fitted to align and clip-on to one of the respective alignment pins 120c of the carrier 120. In another example, the shim 130 may be attached to the carrier 120 by disposing a material (e.g., plastic or the like) into the respective openings 130a during a molding process (or the like) to pattern the material into the respective alignment pins 120c. Such examples may use the other openings 130a (i.e., the smaller, open holes) for a molding tool (or the like) to hold the shims 130 and align the shims 130 onto the carrier 120 during the molding process (e.g., by using a pin in the mold tool cavity). Accordingly, it is to be appreciated that the shims 130 may be attached to the carrier 120 (and in other embodiments to the other stackable components) using any number of processes.

Also, in other embodiments, the shims 130 may be positioned and disposed on any other component (e.g., the board, socket, bolster plate, or electronic package). That is, while four shims 130 disposed on four corner regions of the carrier 120 are shown in FIGS. 1A-1B, it is to be appreciated that embodiments may include one shim 130 or two or more shims 130 that are disposed on any regions of any of the stackable components. Examples of multiple shims 130 with different configurations are provided below in greater detail.

In an embodiment, the shims 130 may have a desired thickness that is described below in greater detail. In an embodiment, the openings 130b may have a diameter that is approximately equal to (or slightly greater than) a diameter of the load studs 104a of the bolster plate 104. That is, after the assembly 100 is completely stacked, the openings 130b are aligned with the load studs 104a that allow the load studs 104a to vertically extend through the openings 130b and to be secured with load nuts 106a of the heatsink 106.

In an embodiment, the shims 130 may be any suitable shimming material. For example, the shims 130 may comprise metals, stainless steel, plastics (e.g., acrylonitrile butadiene styrene (ABS)), highly thermal conductive materials with increased pressure properties, or the like. In some embodiments, the shims 130 may be any suitable shape. Examples of multiple shims 130 with different shapes are provided below in greater detail.

The shims 130 serve as a spacer or the like with a desired thickness that compensates for thickness variations, offsets the spring deflection (or load) of the springs 104b of the bolster plate 104, and provides a load control to limit the deployment and travel of the load studs 104a—and thus avoids any possible damage to the electronic package 110 and socket 108 due to an unexpected (or incorrect) amount of load force. Accordingly, the shims 130 may maintain the load within a desirable range regardless of the thickness variations of the stackable components in the assembly 100. For example, the load may be greater than approximately 200 lb. In some embodiments, the load may be between approximately 200 lb and 350 lb.

Also, since the shims 130 may have multiple thicknesses, shapes, and/or configurations, there are no limitations due to the spring designs of the loading mechanisms, and the thickness tolerances of the packages and/or loading mechanisms. Accordingly, the shims 130 with the desired thickness allows for improvements to increase the load tolerance window without any limitations from the springs 104b or the thicknesses of the stackable components; therefore the shims 130 provide improved load management for the assembly 100 and any type of socket technologies.

In an embodiment, the heatsink 106 comprises a plurality of load nuts 106a and a plurality of fin cutouts 106b. In an embodiment, the loads nuts 106a are disposed on the fin cutouts 106b and are thus aligned over the openings 130b of the shims and the load studs 104a of the bolster plate 104. In some embodiments, the heatsink 106 may be disposed directly over the electronic package 110 and mechanically coupled to the bolster plate 104. That is, in an embodiment, the heatsink 106 may be directly attached to the top surface of the electronic package 110 and the carrier 120 by fastening the loads nuts 106a to the load studs 104a. For one embodiment, the heatsink 106 may be any type of heatsink. For example, the heatsink 106 may be a heatsink, a heat spreader, a heat exchanger, a manifold, a cold plate, or the like.

Figure 2:
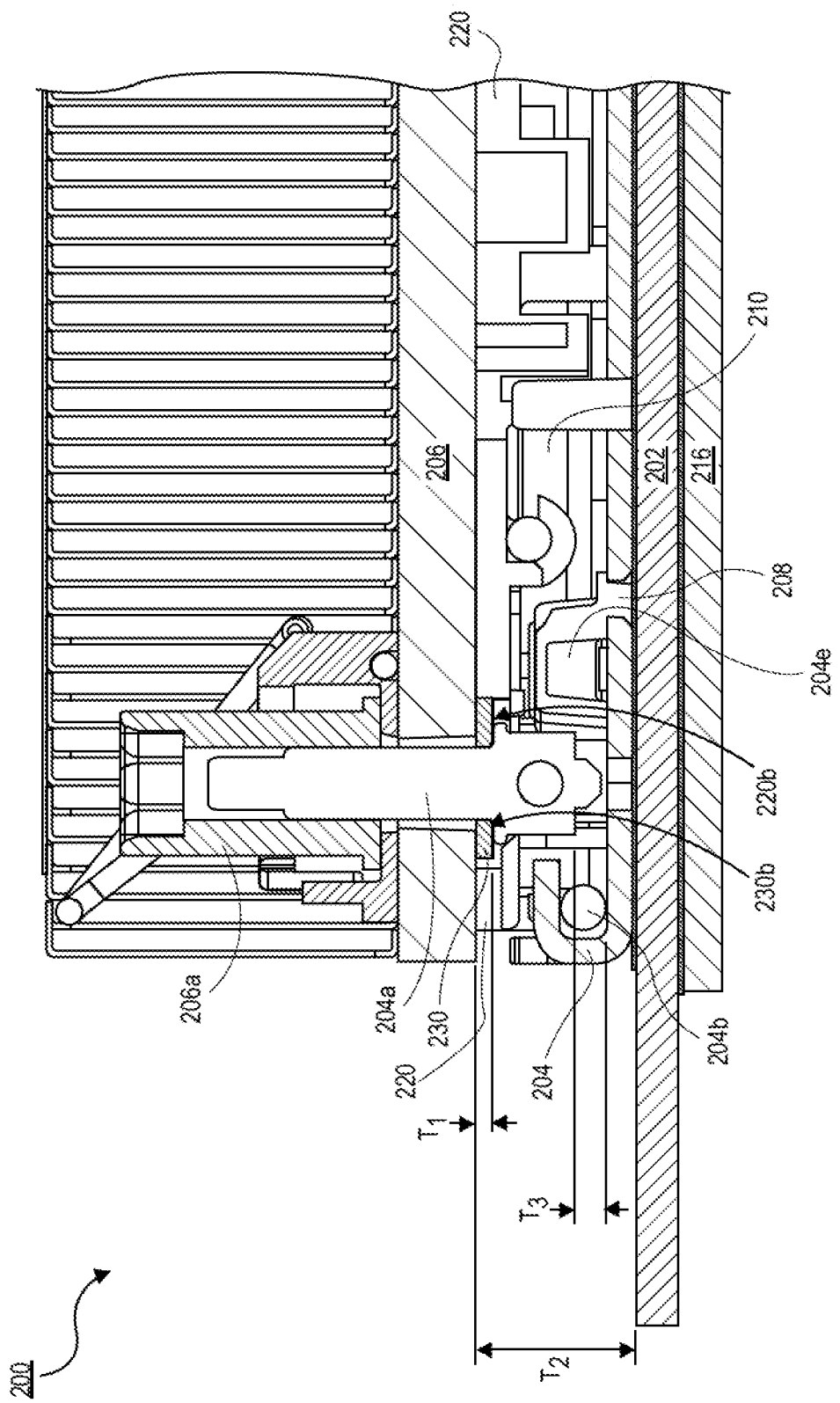
FIG. 2 is a cross-sectional illustration of an assembly with a heatsink, an electronic package, a carrier with a plurality of shims, a bolster plate, a board with a socket, and a back plate, in accordance with an embodiment.

Referring now to FIG. 2, a portion of a cross-sectional illustration of an assembly 200 is shown, in accordance with an additional embodiment. In an embodiment, the assembly 200 may be substantially similar to the assembly 100 in FIG. 1A, with the exception that the stackable components of the assembly 200 are all stacked together in FIG. 2. Accordingly, the assembly 200 comprises a heatsink 206, an electronic package 210, a carrier 220, one or more shims 230 with openings 230b, a bolster plate 204, a board 202 with a socket 208, and a back plate 216 that are similar to those illustrated and described with respect to FIGS. 1A-1B.

As shown, the board 202 is attached to the bolster plate 204 and the back plate 216 by one or more nuts 204e. For example, the bolster plate 204 may be above the board 202, and the back plate 216 may be below the board 202. The bolster plate 204 may surround the socket 208. In an embodiment, the electronic package 210 is affixed within the carrier 220. The shims 230 may be directly disposed on the carrier 220, and the openings 230b may be positioned over one or more cutouts 220b in the carrier 220. In some embodiments, the shims 230 may have a thickness $T_1$. In an embodiment, the thickness $T_1$ may be approximately 1 mm. In one embodiment, the thickness $T_1$ may be greater than approximately 50 µm. In some embodiments, the thickness $T_1$ may be between approximately 50 µm and 5 mm.

The carrier 220 may be affixed onto the bolster plate 204. Particularly, the cutouts 220b of the carrier 220 and the openings 230b of the shims 230 may both be disposed over and aligned by one or more load studs 204a of the bolster plate 204. The heatsink 206 may be attached to the electronic package 210 and the carrier 220. For example, the heatsink 206 may have one or more load nuts 206a that are respectively affixed to the load studs 204a to thereby secure the heatsink 206 directly over the electronic package 210 and the carrier 220. That is, the openings 230b are aligned with the load studs 204a that allow the load studs 204a to vertically extend through the openings 230b and be secured with the load nuts 206a.

As shown, the assembly 200 may have a heatsink base elevation thickness $T_2$ that is defined from the top surface of the board 202 to the bottom surface of the heatsink 206. In an embodiment, the thickness $T_2$ may be greater than approximately 7.5 mm. In some embodiments, the thickness $T_2$ may be between approximately 7.5 mm and 10 mm. In one embodiment, the thickness $T_2$ may be between approximately 8.9 mm and 9.4 mm. In another embodiment, the thickness $T_2$ may be between approximately 7.8 mm and 8.2 mm. However, it is to be appreciated that the thickness $T_2$ may be any desired thickness based on the desired packaging design.

In the illustrated embodiment, the bolster plate 204 may have one or more springs 204b (e.g., torsion springs), where each spring 204b may be anchored at one end (e.g., as shown with the anchor ends 104c in FIG. 1A) and coupled to the respective load stud 204a at the opposite end. In some embodiments, when the load nuts 206a of the heatsink 206 are affixed to the load studs 204a of the bolster plate 204, the heatsink 206 exerts a pressure (or tension) on the springs 204b that are downwardly extended by a load spring deflection thickness $T_3$. In an embodiment, the thickness $T_3$ may be between approximately 1 mm and 3 mm. Whereas, in other embodiments, the thickness $T_3$ may be any desired thickness based on the desired thickness $T_1$ and/or thickness $T_2$.

Referring now to FIGS. 3-6, a series of perspective, exploded view illustrations depict assemblies 300, 400, 500, and 600, respectively, in accordance with additional embodiments. In FIGS. 3-6, the assemblies 300, 400, 500, and 600 include the respective shims 330, 430, 530, and 630 and the stackable components that are similar to those illustrated and described with respect to FIGS. 1A-1B and 2. However, with respect to FIGS. 3-6, it is to be appreciated that each of the substantially similar assemblies 300, 400, 500, and 600 may substitute (or replace) one or more packaging components for the stackable components, shims, and/or configurations of the other assemblies illustrated and described below. For example, instead of using the shim 330 illustrated and described below in FIG. 3, the assembly 300 may be implemented with the shims 430 of the assembly 400 in FIG. 4, in accordance with an alternative embodiment.

Figure 3:
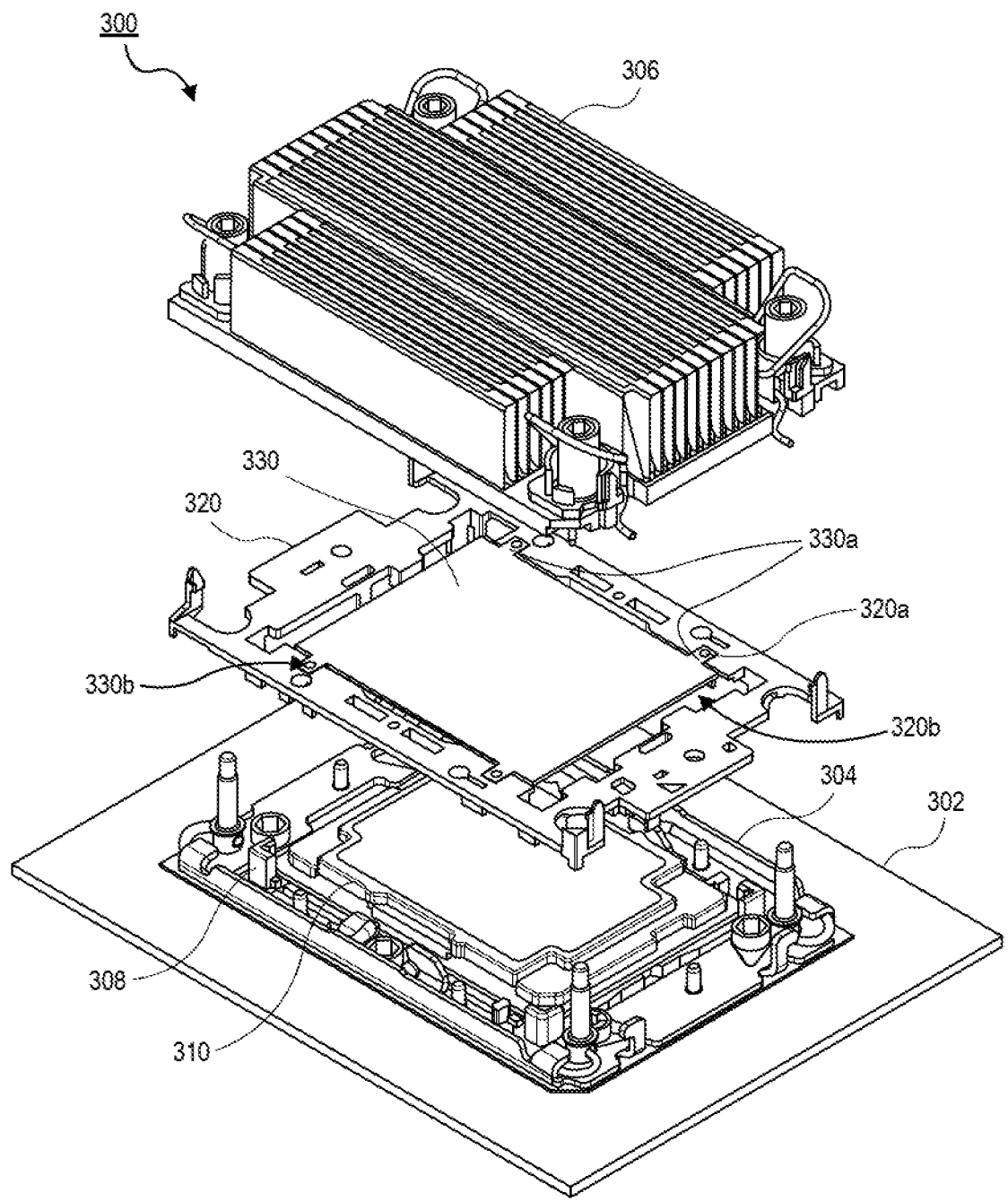
FIG. 3 is a perspective, exploded view illustration of an assembly with a heatsink, a carrier with a shim, an electronic package, a bolster plate, a board with a socket, and a back plate, in accordance with an embodiment.

Referring now to FIG. 3, a perspective, exploded view illustration of an assembly 300 is shown, in accordance with an additional embodiment. In an embodiment, the assembly 300 may be substantially similar to the assemblies 100 and 200 in FIGS. 1A and 2, with the exceptions that the shim 330 is directly affixed within the carrier 320, and that the shim 330 is directly in between the bottom surface of the heatsink 306 and the top surface of the electronic package 310 to thereby increase the spring extended thickness and load of the assembly 300. Accordingly, the assembly 300 comprises a heatsink 306, an electronic package 310, a carrier 320, a shim 330, a bolster plate 304, and a board 302 with a socket 308 that are similar to those illustrated and described with respect to FIGS. 1A and 2.

As shown, in an embodiment, the shim 330 comprises one or more prongs 330a with one or more openings 330b. In an embodiment, the carrier 320 comprises one or more alignment pins 320a and an opening 302b. Accordingly, as shown in the illustrated embodiment, the alignment pins 320a are inserted into the openings 330b of the prongs 330a to directly affix the shim 330 within the opening 320b of the carrier 320. In some embodiments, the shim 330 may comprise any highly conductive material (e.g., copper or the like). Also, in other embodiments, the shim 330 may comprise any type of thermal interface materials (TIM). For example, the TIM(s) may be disposed over the top and bottom surfaces of the shim 330, as such the TIM(s) may be between the electronic package 310 and shim 330 as well as between the heatsink 306 and shim 330.

Figure 4:
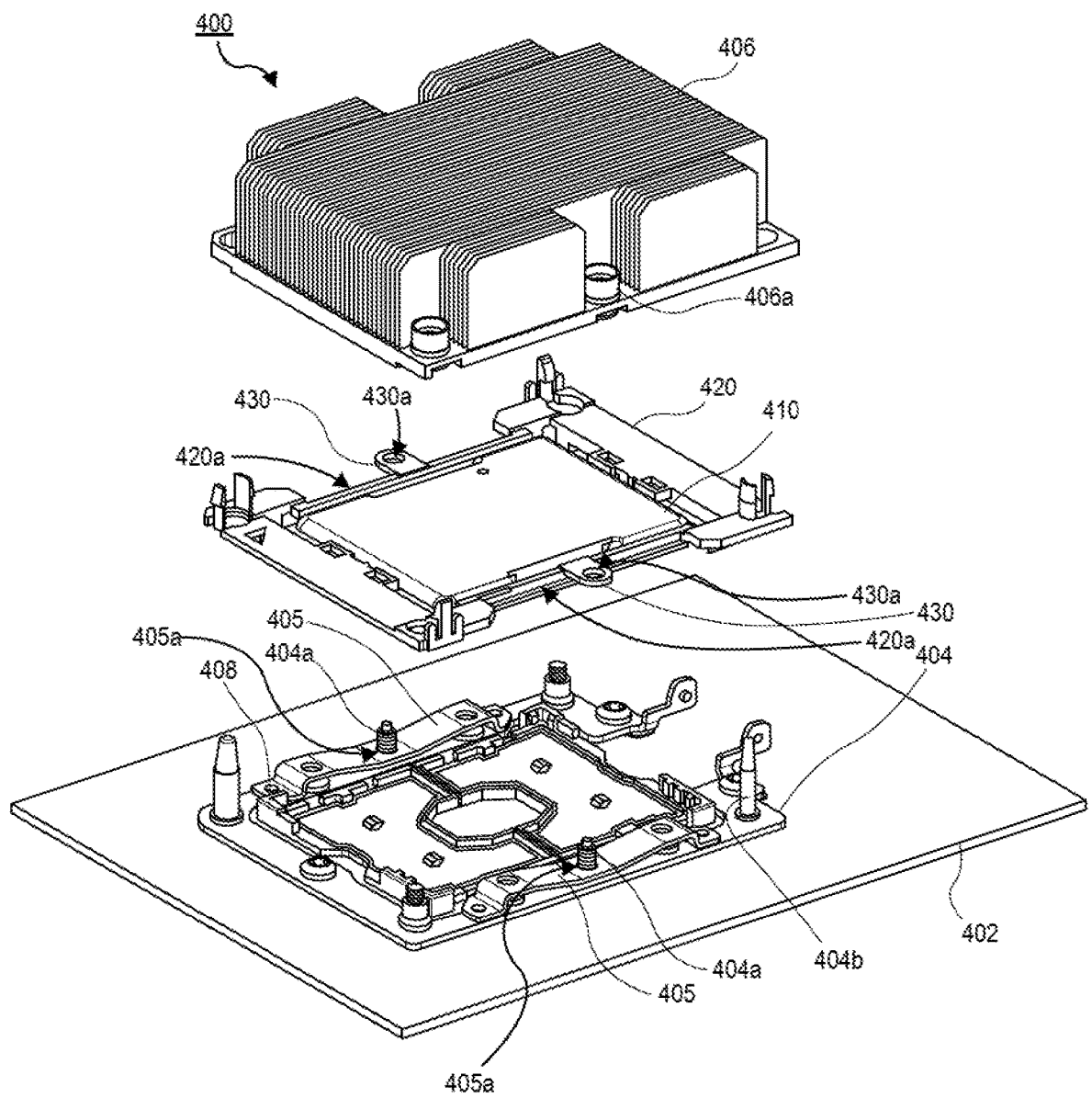
FIG. 4 is a perspective, exploded view illustration of an assembly with a heatsink, a carrier with a plurality of shims, an electronic package, a bolster plate, a board with a socket, and a back plate, in accordance with an embodiment.

Referring now to FIG. 4, a perspective, exploded view illustration of an assembly 400 is shown, in accordance with an additional embodiment. In an embodiment, the assembly 400 may be substantially similar to the assemblies 100 and 200 in FIGS. 1A and 2, with the exceptions that the springs 405 are affixed on the long sides of the bolster plate 405, and that the shims 430 are affixed to the center regions of the long sides of the carrier 420. In an embodiment, the assembly 400 comprises a heatsink 406, an electronic package 410, a carrier 420, one or more shims 430 with openings 430a, a bolster plate 404, and a board 402 with a socket 408 that are similar to those illustrated and described with respect to FIGS. 1A and 2. While two shims 430 are shown in FIG. 4, it is to be appreciated that embodiments may include one shim 430 or three or more shims 430.

In an embodiment, the bolster plate 404 may have one or more load screws 404a. In an embodiment, the springs 405 may be any type of spring loading mechanism that comprises one or more openings 405a, and that may be attached to the bolster plate 404 with screws 404a or the like. As shown, the springs 405 may be disposed on the long sides of the bolster plate 404, where the load screws 404a vertically extend through the center openings 405a. Additionally, the shims 430 may be attached to the center regions on the long sides of the carrier 420. Particularly, in such embodiments, the openings 430a of the shims 430 may be positioned over the cutouts 420a of the carrier 420. Accordingly, as shown in FIG. 4, the openings 430a may be aligned with the center openings 405a and the load screws 404a in order to ultimately affix the load nuts 406a of the heatsink 406 onto the load screws 404a of the bolster plate 404.

Figure 5A:
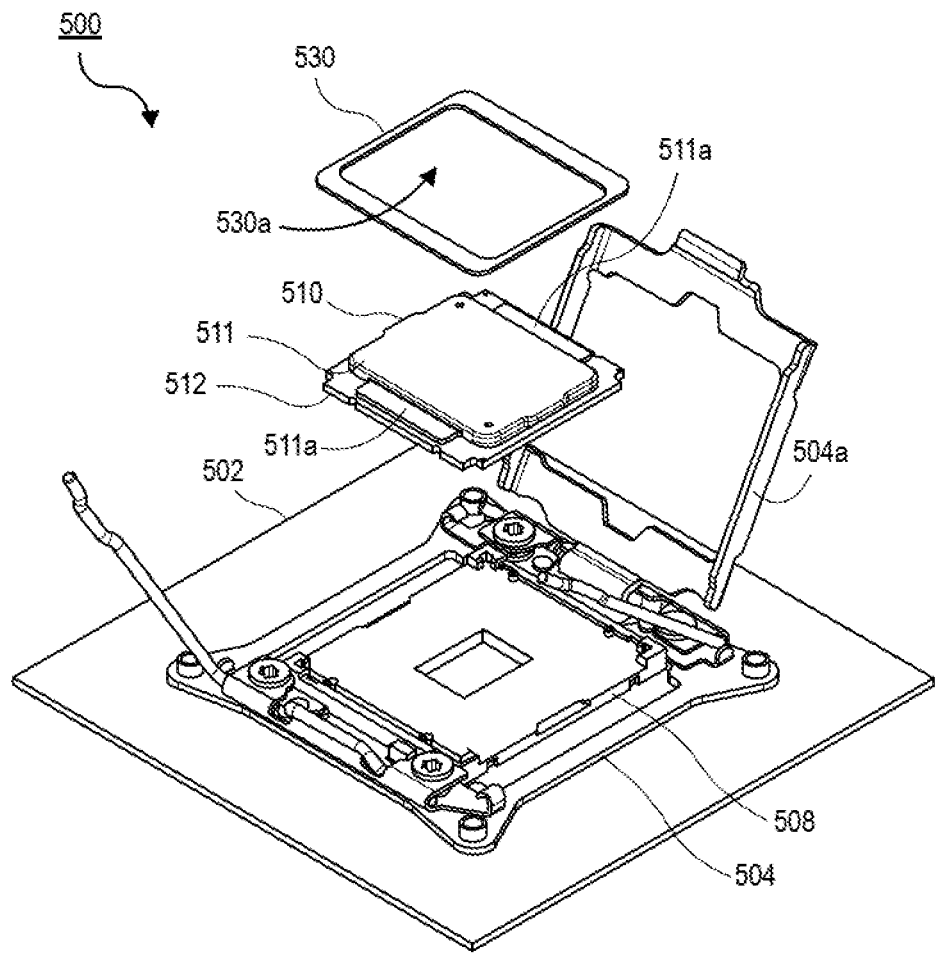
FIG. 5A is a perspective, exploded view illustration of an assembly with a heatsink, a carrier with a shim, an electronic package, a bolster plate, a board with a socket, and a back plate, in accordance with some embodiment.
Figure 5B:
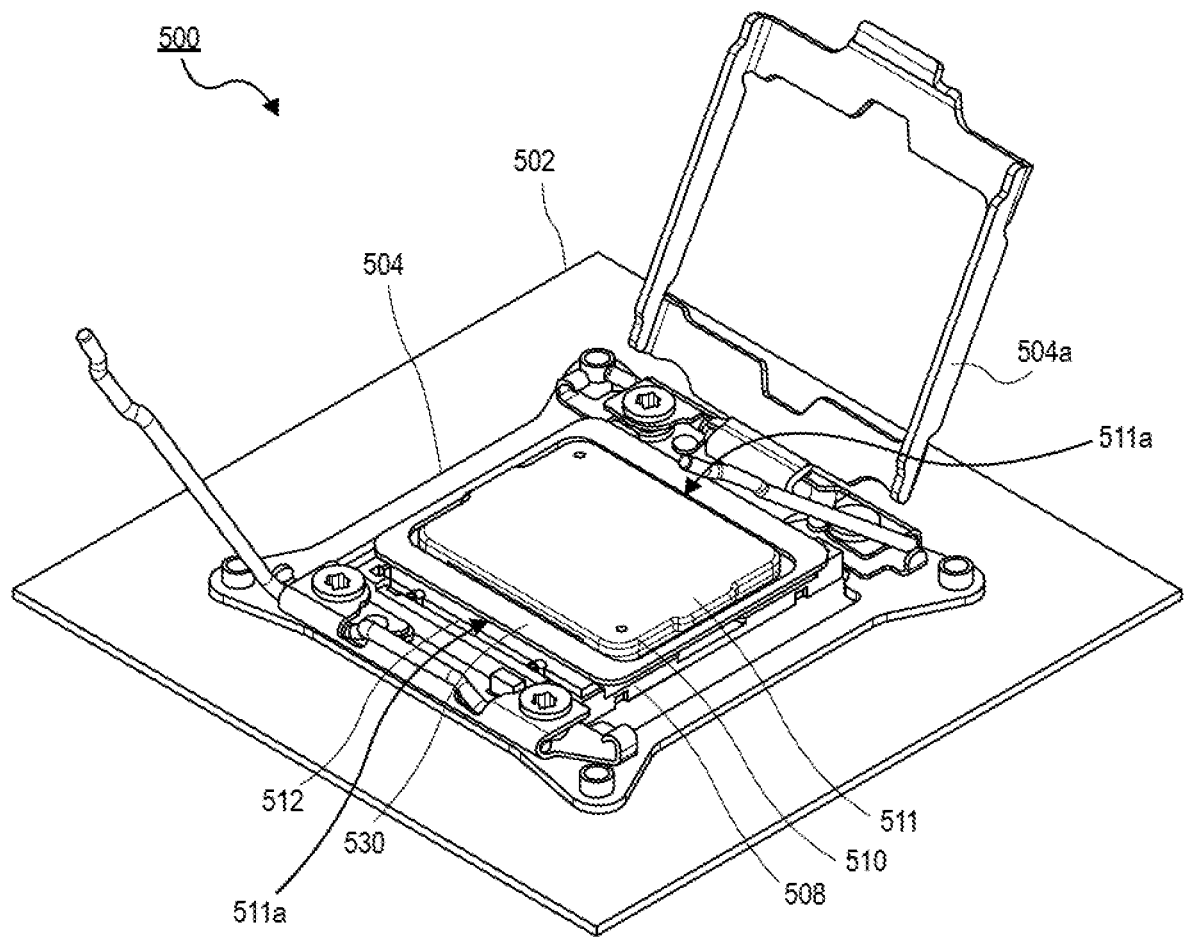
FIG. 5B is a perspective, stacked view illustration of an assembly with a heatsink, a carrier with a shim, an electronic package, a bolster plate, a board with a socket, and a back plate, in accordance with some embodiment.

Referring now to FIGS. 5A-5B, a series of perspective view illustrations of an assembly 500 before and after the stackable components are stacked together is shown, in accordance with additional embodiments. In an embodiment, the assembly 500 may be substantially similar to the assemblies 100 and 200 in FIGS. 1A and 2, with the exceptions that the shim 530 is directly disposed on the IHS step regions 511a of the electronic package 510, that an opening 530a of the shim 530 surrounds the IHS 511, and that the shim 530 is directly in between the top surface of the IHS step regions 511 and the bottom surface of the cover 504a of the bolster plate 504 to thereby increase the spring extended thickness and load of the assembly 500. In an embodiment, the assembly 500 comprises an electronic package 510, a shims 530 with an opening 530a, a bolster plate 504, and a board 502 with a socket 508 that are similar to those illustrated and described with respect to FIGS. 1A and 2.

As shown, the shim 530 may be a ring-shaped shim with the opening 530a that is large enough to fully surround the IHS 511. In an embodiment, the shim 530 may have a footprint that substantially covers a footprint of the electronic package 510. Lastly, as shown in FIG. 5B, the shim 530 is directly disposed over the IHS step regions 511 and the package substrate 512 of the electronic package 510. In one embodiment, the cover 504a may be a part of the bolster plate 504. While, in other embodiments, the cover 504a may be affixed to the bolster plate 504. Subsequently, when the cover 504a is secured by the bolster plate 504, the shim 530 may be directly attached to the cover 504a and the IHS step regions 511a. Also, when the cover 504a is in a closed position, the shim 530 may be positioned proximate to the one or more springs of the bolster plate 504.

Figure 6:
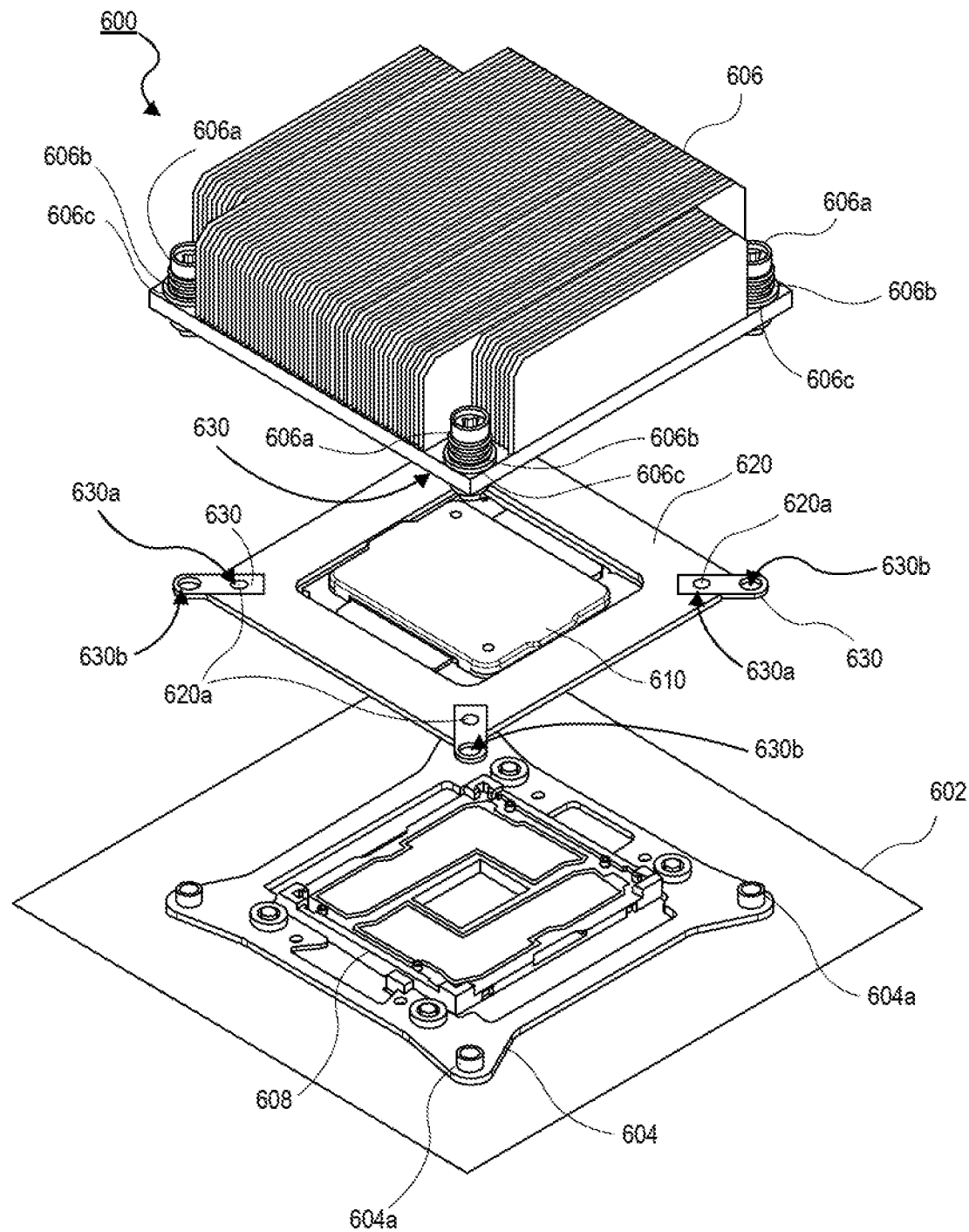
FIG. 6 is a perspective, exploded view illustration of an assembly with a heatsink, an electronic package, a carrier with a plurality of shims, a bolster plate, a board with a socket, and a back plate, in accordance with an embodiment.

Referring now to FIG. 6, a perspective, exploded view illustration of an assembly 600 is shown, in accordance with an additional embodiment. In an embodiment, the assembly 600 may be substantially similar to the assemblies 100 and 200 in FIGS. 1A and 2, with the exception that the springs 606b are disposed on the corner regions of the heatsink 606. In an embodiment, the assembly 600 comprises a heatsink 606, an electronic package 610, a carrier 620, one or more shims 630 with openings 630a-b, a bolster plate 604, and a board 602 with a socket 608 that are similar to those illustrated and described with respect to FIGS. 1A and 2. While four shims 630 are shown in FIG. 6, it is to be appreciated that embodiments may include one, two, or three shims 630 or five or more shims 630.

In an embodiment, the bolster plate 604 may have one or more load nuts 604a. In an embodiment, the heatsink 606 may have one or more load screws 606a and one or more washers 606c (or the like). In some embodiments, the washers 606c may be disposed above the top surface of the heatsink 606 and/or below the bottom surface of the heatsink 606. As shown, the springs 606b may be disposed on the corner regions of the heatsink 606, where the load screws 606a vertically extend through the springs 606b (i.e., through vertical openings in the springs 606b). That is, in one embodiment, the springs 606b may be directly disposed between the heads of the load screws 606a and the washers 606c. In other embodiments, the washers 606c may be omitted and, therefore, the springs 606b may be directly disposed between the heads of the loads screws 606a and the corner regions of the top surface of the heatsink 606. As shown, the shims 630 may be attached to the corner regions of the carrier 620 by affixing the alignment pins 620a into the respective openings 630a. Accordingly, as shown in FIG. 6, the openings 630b may be aligned with the load nuts 604a and the load screws 606a in order to ultimately affix the load screws 606a of the heatsink 606 onto the load nuts 604a of the bolster plate 604.

Figure 7:
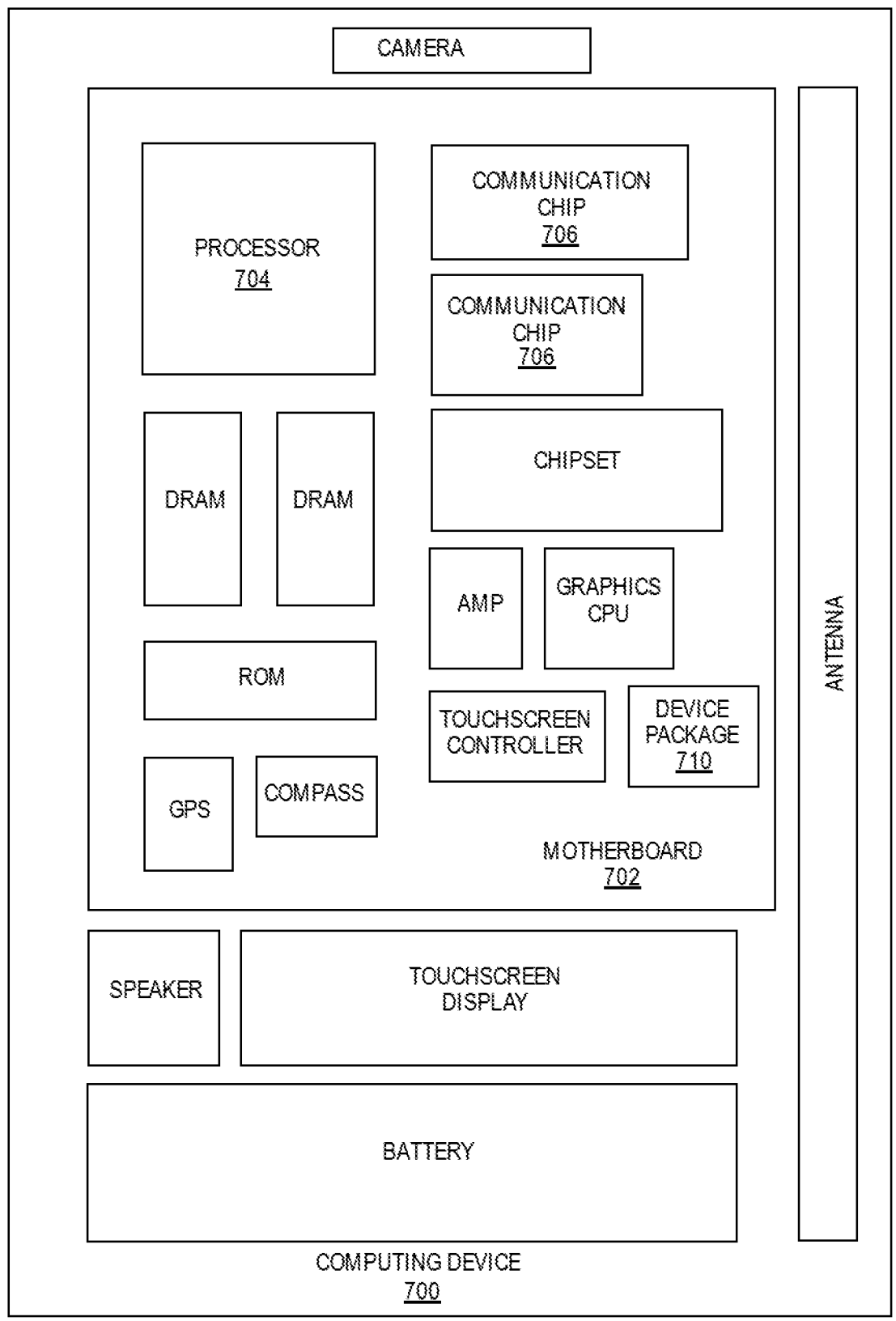
FIG. 7 is a schematic of a computing device with an assembly with a heatsink, an electronic package, a carrier with a plurality of shims, a bolster plate, a board with a socket, and a back plate, in accordance with an embodiment

FIG. 7 illustrates a computing device 700 in accordance with one implementation of the embodiments described herein. FIG. 7 illustrates an example of computing device 700. Computing device 700 houses a motherboard 702. Motherboard 702 may include a number of components, including but not limited to processor 704, device package 710 (or electronic package), and at least one communication chip 706. Processor 704 is physically and electrically coupled to motherboard 702. For some embodiments, at least one communication chip 706 is also physically and electrically coupled to motherboard 702. For other embodiments, at least one communication chip 706 is part of processor 704.

Depending on its applications, computing device 700 may include other components that may or may not be physically and electrically coupled to motherboard 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

At least one communication chip 706 enables wireless communications for the transfer of data to and from computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 706 may implement any of a number of wireless standards or protocols, including but not limited to Wi-Fi (IEEE 802.11 family), WiMAX (IEEE 802.112 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 700 may include a plurality of communication chips 606. For instance, a first communication chip 706 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

Processor 704 of computing device 700 includes an integrated circuit die packaged within processor 704. The term "processor" may refer to any device or portion of a device that processes electronic data from registers and/or memory to transform that electronic data into other electronic data that may be stored in registers and/or memory. Device package 710 may be an electronic packaged assembly. In one embodiment, device package 710 may be substantially similar to the assembly 100 in FIG. 1A. Device package 710 may include shims as described herein (e.g., as illustrated and described above with the shims in FIGS. 1A-1B, 2-4, 5A-5B, and 6)—or any other components from the figures described herein.

Note that device package 710 may be a single component/device, a subset of components, and/or an entire system, as the materials, features, and components may be limited to device package 710 and/or any other component of the computing device 700 that may need the shims as described herein (e.g., the motherboard 702, the processor 704, the communication chips 706, and/or any other component of the computing device 700 that may need the embodiments described herein).

At least one communication chip 706 also includes an integrated circuit die packaged within the communication chip 706. For some embodiments, the integrated circuit die of the communication chip 706 may be packaged with one or more devices on an electronic packaged assembly that includes shims as described herein.

In the foregoing specification, embodiments have been described with reference to specific exemplary embodiments thereof. It should be borne in mind, however, that all of these and similar terms are to be associated with the appropriate physical quantities and are merely convenient labels applied to these quantities. It will be evident that various modifications may be made thereto without departing from the broader spirit and scope. The specification and drawings are, accordingly, to be regarded in an illustrative sense rather than a restrictive sense.

The following examples pertain to further embodiments. The various features of the different embodiments may be variously combined with some features included and others excluded to suit a variety of different applications.

The following examples pertain to further embodiments:

Example 1: an assembly, comprising: a socket on a board; a bolster plate on the board, wherein the bolster plate has a plurality of load studs and an opening that surrounds the socket; a carrier on the bolster plate, wherein the carrier has an opening and a plurality of cutouts; a shim having a first end and a second end opposite from the first end, wherein the shim has an opening through the first end, wherein the second end of the shim is affixed to the carrier, and wherein the opening of the shim is entirely over one of the cutouts from a corner region of the carrier; an electronic package in the opening of the carrier, wherein the electronic package is affixed to the carrier; and a heatsink over the electronic package and the carrier, wherein the first end of the shim is directly coupled to a surface of the heatsink and a surface of one of the load studs of the bolster plate.

Example 2: the assembly of Example 1, wherein the shim has a thickness that is approximately 50 μm or greater.

Example 3: the assembly of Examples 1-2, wherein the heatsink has a plurality of load nuts, and wherein the one load stud vertically extends through the opening of the shim to affix the bolster plate to one of the load nuts of the heatsink.

Example 4: the assembly of Examples 1-3, wherein the shim has a second opening through the second end, wherein the carrier has a plurality of alignment pins, wherein the second opening of the shim is affixed to one of the alignment pins of the carrier, wherein the second end is directly between a surface of the carrier and the surface of the heatsink, and wherein the first end is directly between the surface of the heatsink and the surface of the one load stud of the bolster plate.

Example 5: the assembly of Examples 1-4, wherein the bolster plate has a spring and an anchor, wherein the spring has a first end and a second end that is opposite from the first end, wherein the spring horizontally extends from the first end to the second end, wherein the first end is directly coupled to the one load stud, and the second end is directly coupled to the anchor, and wherein the opening of the shim is aligned over the first end of the spring.

Example 6: the assembly of Examples 1-5, further comprising: a back plate on a bottom surface of the board, wherein the bolster plate and the socket are on a top surface of the board that is opposite form the bottom surface, wherein the back plate has a plurality of screws, wherein the bolster plate has a plurality of nuts, and wherein each screw of the back plate is affixed to one of the nuts of the bolster plate; and a plurality of shims having first ends and second ends opposite from the first ends, wherein the plurality of shims have openings through the first ends, wherein the second ends of the plurality of shims are affixed to the carrier, wherein the openings of the plurality of shims are entirely over the other cutouts of the carrier, and wherein the first ends of the plurality of shims are directly between the heatsink and the bolster plate.

Example 7: the assembly of Examples 1-6, wherein the electronic package has a footprint that is entirely within a footprint of the socket, and wherein the electronic package is electrically coupled to the socket.

Example 8: an assembly, comprising: a socket on a board; a bolster plate on the board, wherein the bolster plate has an opening that surrounds the socket; an electronic package on the socket; a carrier on the bolster plate, wherein the carrier has an opening and a plurality of alignment pins; a shim in the opening of the carrier, wherein the shim comprises a plurality of prongs and a plurality of openings, wherein each opening is through one of the prongs, wherein the plurality of openings of the shim are affixed to the plurality of alignment pins of the carrier, and wherein the shim has a footprint that entirely covers a footprint of a top surface of the electronic package; and a heatsink over the shim and the carrier, wherein the shim is directly between a bottom surface of the heatsink and the top surface of the electronic package.

Example 9: the assembly of Example 8, wherein the shim has a thickness that is approximately 50 µm or greater.

Example 10: the assembly of Examples 8-9, the heatsink is directly affixed to the carrier and the bolster plate.

Example 11: the assembly of Examples 8-10, wherein the bolster plate has a load stud, a spring, and an anchor, wherein the spring has a first end and a second end that is opposite from the first end, wherein the spring horizontally extends from the first end to the second end, wherein the first end is directly coupled to the load stud, and the second end is directly coupled to the anchor, and wherein one of the prongs of the shim are aligned over the spring.

Example 12: the assembly of Examples 8-11, further comprising: a back plate on a bottom surface of the board, wherein the bolster plate and the socket are on a top surface of the board that is opposite form the bottom surface, wherein the back plate has a plurality of screws, wherein the bolster plate has a plurality of nuts, and wherein each screw of the back plate is affixed to one of the nuts of the bolster plate; a first thermal interface material (TIM) on a top surface of the shim; and a second TIM on a bottom surface of the shim.

Example 13: the assembly of Examples 8-12, wherein the first TIM is directly coupled to the top surface of the shim and the bottom surface of the heatsink, wherein the second TIM is directly coupled to the bottom surface of the shim and the top surface of the electronic package, and wherein the electronic package is electrically coupled to the socket.

Example 14: the assembly of Examples 8-13, wherein the shim comprises one or more highly thermal conductive materials.

Example 15: an assembly, comprising: a socket on a board; a bolster plate on the board, wherein the bolster plate has an opening that surrounds the socket; a carrier on the bolster plate, wherein the carrier has an opening; a plurality of shims affixed to the carrier, wherein each shim has a first end and a second end opposite from the first end, wherein each shim has a first opening through the first end and a second opening through the second end, wherein the second ends with the second openings are within a footprint of the carrier, and wherein the first ends with the first openings are outside the footprint of the carrier; an electronic package in the opening of the carrier, wherein the electronic package is affixed to the carrier; and a heatsink over the electronic package and the carrier, wherein the heatsink has a plurality of load screws, a plurality of springs, and a plate, wherein each load screw has a top end and a bottom end that is opposite from the top end, where the plate has a top surface and a bottom surface that is opposite from the top surface, wherein each spring is between the top surface of the plate and the top end of one of the load screws, and wherein the first ends of the plurality of shims are directly between the bottom surface of the plate and a top surface of the bolster plate.

Example 16: the assembly of Example 15, wherein the shim has a thickness that is approximately 50 µm or greater.

Example 17: the assembly of Examples 15-16, wherein each spring has a spring opening, wherein the plate of the heatsink has a plurality of openings, wherein the bolster plate has a plurality of load nuts, wherein each load screw vertically extends, respectively, through the spring opening of each spring, one of the openings of the plate, and the first opening of each shim, and wherein each bottom end of the load screws of the heatsink is affixed to each load nut of the bolster plate.

Example 18: the assembly of Examples 15-17, wherein the carrier has a plurality of alignment pins, wherein each second opening of the shims is affixed to one of the alignment pins of the carrier, and wherein the second ends of the shims are directly between a top surface of the carrier and the bottom surface of the plate of the heatsink.

Example 19: the assembly of Examples 15-18, wherein each spring vertically extends from one of the top ends of the load screws to the top surface of the plate, and wherein each first opening of the shims is aligned below each of the springs of the heatsink.

Example 20: the assembly of Examples 15-19, further comprising: a back plate on a bottom surface of the board, wherein the bolster plate and the socket are on a top surface of the board that is opposite form the bottom surface, wherein the back plate has a plurality of screws, wherein the bolster plate has a plurality of nuts, wherein each screw of the back plate is affixed to one of the nuts of the bolster plate, wherein the electronic package has a footprint that is entirely within a footprint of the socket, and wherein the electronic package is electrically coupled to the socket; and a plurality of washers having openings, where each washer is positioned directly between each spring and the top surface of the plate of the heatsink, and wherein each load screw vertically extends through, respectively, each opening of the washers and one of the openings of the plate.

Example 21: an assembly, comprising: a socket on a board; a bolster plate on the board, wherein the bolster plate has an opening that surrounds the socket; an electronic package on the socket, wherein the electronic package comprises an integrated heat spreader (IHS), one or more IHS steps, a die, and a substrate; a shim on the electronic package, wherein the shim has an opening, wherein the shim has a top surface and a bottom surface that is opposite from the top surface, wherein the bottom surface of the shim is directly coupled to a top surface of the IHS steps of the electronic package, wherein the IHS of the electronic package has a footprint that is entirely within an inner footprint of the opening of the shim, and wherein the shim has an outer footprint that substantially covers a footprint of the substrate of the electronic package; and a cover over the shim, wherein the cover is affixed to the bolster plate, and wherein the shim is directly coupled to a bottom surface of the cover and the top surface of the IHS steps of the electronic package.

Example 22: the assembly of Example 21, wherein the shim has a thickness that is approximately 50 µm or greater.

Example 23: the assembly of Examples 21-22, wherein the bolster plate has a plurality of springs, and wherein the shim is proximate to one or more of the springs.

Example 24: the assembly of Examples 21-23, wherein further comprising: a back plate on a bottom surface of the board, wherein the bolster plate and the socket are on a top surface of the board that is opposite form the bottom surface, wherein the back plate has a plurality of screws, wherein the bolster plate has a plurality of nuts, and wherein each screw of the back plate is affixed to one of the nuts of the bolster plate; and a heatsink over the cover, the shim, and the electronic package.

Example 25: the assembly of Examples 21-24, wherein the die is on a center region on a top surface of the substrate, wherein the IHS is on the top surface of the substrate, and the IHS is over and around the die, wherein the IHS steps are on the top surface of the substrate, wherein the IHS steps are outside of the footprint of the IHS, wherein the cover has an opening with a footprint that is greater than the footprint of the IHS, wherein a top surface of the IHS is directly coupled to a bottom surface of the heatsink, and wherein the electronic package is electrically coupled to the socket.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

In the foregoing specification, methods and apparatuses have been described with reference to specific exemplary embodiments thereof. It will be evident that various modifications may be made thereto without departing from the broader spirit and scope. The specification and drawings are, accordingly, to be regarded in an illustrative sense rather than a restrictive sense.

What is claimed is:

1. An assembly, comprising:
   a socket on a board;
   a bolster plate on the board, wherein the bolster plate has a plurality of load studs and an opening that surrounds the socket;
   a carrier on the bolster plate, wherein the carrier has an opening and a plurality of cutouts;
   a shim having a first end and a second end opposite from the first end, wherein the shim has an opening through the first end, wherein the second end of the shim is affixed to the carrier, and wherein the opening of the shim is entirely over one of the cutouts from a corner region of the carrier;
   an electronic package in the opening of the carrier, wherein the electronic package is affixed to the carrier; and
   a heatsink over the electronic package and the carrier, wherein the first end of the shim is directly coupled to a surface of the heatsink and a surface of one of the load studs of the bolster plate.

2. The assembly of claim 1, wherein the shim has a thickness that is approximately 50 µm or greater.

3. The assembly of claim 1, wherein the heatsink has a plurality of load nuts, and wherein the one load stud vertically extends through the opening of the shim to affix the bolster plate to one of the load nuts of the heatsink.

4. The assembly of claim 1, wherein the shim has a second opening through the second end, wherein the carrier has a plurality of alignment pins, wherein the second opening of the shim is affixed to one of the alignment pins of the carrier, wherein the second end is directly between a surface of the carrier and the surface of the heatsink, and wherein the first end is directly between the surface of the heatsink and the surface of the one load stud of the bolster plate.

5. The assembly of claim 1, wherein the bolster plate has a spring and an anchor, wherein the spring has a first end and a second end that is opposite from the first end, wherein the spring horizontally extends from the first end to the second end, wherein the first end is directly coupled to the one load stud, and the second end is directly coupled to the anchor, and wherein the opening of the shim is aligned over the first end of the spring.

6. The assembly of claim 1, further comprising:
   a back plate on a bottom surface of the board, wherein the bolster plate and the socket are on a top surface of the board that is opposite form the bottom surface, wherein the back plate has a plurality of screws, wherein the bolster plate has a plurality of nuts, and wherein each screw of the back plate is affixed to one of the nuts of the bolster plate; and
   a plurality of shims having first ends and second ends opposite from the first ends, wherein the plurality of shims have openings through the first ends, wherein the second ends of the plurality of shims are affixed to the carrier, wherein the openings of the plurality of shims are entirely over the other cutouts of the carrier, and wherein the first ends of the plurality of shims are directly between the heatsink and the bolster plate.

7. The assembly of claim 1, wherein the electronic package has a footprint that is entirely within a footprint of the socket, and wherein the electronic package is electrically coupled to the socket.

* * * * *